United States Patent [19]

Kuribayashi

[11] Patent Number: 5,768,313
[45] Date of Patent: Jun. 16, 1998

[54] ADAPTIVE EQUILIZER

[75] Inventor: Hiroki Kuribayashi, Tsurugashima, Japan

[73] Assignee: Pioneer Electronic Corporation, Tokyo, Japan

[21] Appl. No.: 852,378

[22] Filed: May 7, 1997

[30] Foreign Application Priority Data

May 28, 1996 [JP] Japan ................................. 8-133895

[51] Int. Cl.$^6$ ........................... H03H 7/30; H03H 7/40
[52] U.S. Cl. ........................ 375/232; 375/229; 375/230; 375/233; 364/724.19; 364/724.2
[58] Field of Search .......................... 375/232, 233, 375/229, 230; 364/724.19, 724.2

[56] References Cited

U.S. PATENT DOCUMENTS

| | | | |
|---|---|---|---|
| 3,992,616 | 11/1976 | Acker | 235/156 |
| 4,097,807 | 6/1978 | Fujimura | 325/42 |
| 5,321,559 | 6/1994 | Nguyen et al. | 360/46 |

*Primary Examiner*—Stephen Chin
*Assistant Examiner*—Frederick Yu
*Attorney, Agent, or Firm*—Sughrue, Mion, Zinn, Macpeak & Seas, PLLC

[57] ABSTRACT

An adaptive equalizer performs adaptive signal processing on an input digital signal passing through a transfer path so as to minimize an equalization error and sends out a digital signal obtained by the adaptive signal processing. This adaptive equalizer comprises: a variable coefficient filter for performing a filtering process on the input digital signal based on a coefficient set therein; an error detection system for detecting the equalization error; and a coefficient control section for controlling the coefficient based on the equalization error. The coefficient control section includes: a discrimination circuit for discriminating if an absolute value of each sample value of the input digital signal is greater than a predetermined value; and a coefficient generating section for, when the absolute value is discriminated as greater than the predetermined value by the discrimination means, generating the coefficient based on a value obtained by giving a sign according to the sign of that sample value to the equalization error. This adaptive equalizer contributes to reducing the circuit scale while maintaining a high data transfer efficiency.

6 Claims, 12 Drawing Sheets

(a) INPUT TO TRANSFER PATH (b) OUTPUT OF EQUALIZER (c) OUTPUTS OF $e_{10}'$, $e_9'$, $e_7'$, $e_6'$, $e_4'$, $e_3'$, $e_2'$ (d) OUTPUTS OF $S_{10}$, $S_9$, $S_4$, $S_3$, $S_2$ (e) OUTPUTS OF $S_7$, AND $S_6$ (f) OUTPUT OF $S_8$ 5,768,313

1

ADAPTIVE EQUILIZER

BACKGROUND OF THE INVENTION

1. Field of the Invention

The present invention relates generally to an adaptive equalizer.

2. Description of the Related Arts

Adaptive filters or adaptive equalizers have been used to equalize the transfer characteristic of a transfer path to the desired characteristic. An adaptive equalizer adapts its own transfer characteristic to a change in the transfer characteristic in the input signal system and transfers proper signals to the output signal system. The general structure of such an adaptive equalizer is illustrated in FIG. 1.

In FIG. 1, an input digital signal which is a discrete signal is supplied to a system which has cascade-connected n unit delay elements $D_1$ to $D_n$. The unit delay elements $D_1$–$D_n$ provide a time delay equivalent to the sampling period of the input digital signal; the output of one unit delay element becomes an input obtained one sampling period before. The input digital signal and the output signals of the individual unit delay elements are respectively supplied to multipliers $M_0$ to $M_n$ and coefficient control circuits $C_0$ to $C_n$. The coefficient control circuits $C_0$–$C_n$ control coefficients by which the input digital signal and the output signals of the unit delay elements $D_1$–$D_n$ are multiplied in the associated multipliers $M_0$–$M_n$, and provide the multipliers $M_0$–$M_n$ with the resultant coefficients.

The multiplication results from the multipliers $M_0$–$M_n$ are added together by an adder A, and the addition result is led out as an output digital signal or the output of the adaptive equalizer. This output digital signal is sent to a subtracter S. The subtracter S obtains the difference between the value of the output digital signal and a reference value and sends this difference to the coefficient control circuits $C_0$–$C_n$. The reference value given to the subtracter S is so set as to direct the general transfer characteristic of both the adaptive equalizer and its input signal system to an ideal or target transfer characteristic.

Each of the coefficient control circuits $C_0$–$C_n$ comprises an associated one of multipliers $m_0$ to $m_n$, which multiplies the value of the input digital signal or the value of the output signal of the associated unit delay element by the value of a difference signal from the subtracter S, and an associated one of integrators $i_0$ to $i_n$ which integrates the associated multiplication output. The outputs of the integrators $i_0$–$i_n$ are supplied to the respective multipliers $M_0$–$M_n$ as controlled coefficient values.

According to the thus constituted adaptive equalizer, a so-called equalization error is obtained by the subtracter S and the tap coefficients or the multiplication coefficients to be sent to the multipliers $M_0$–$M_n$ are updated based on the results of multiplication of the input digital signal and the output signals of the unit delay elements by this error. This function causes the equalization error to approach zero so that the output signal of the adaptive equalizer is transferred with the target transfer characteristic which is given by the reference value.

The reference value to be given to the subtracter S should be however determined according to the value which the input digital signal will take. This necessitates that the reference value is determined on the premise of a probable value of the input digital signal or a predetermined value (sample value) is previously included in the input digital signal at the time of generating the input digital signal in

2 order to ensure the assumption. This requirement is disadvantageous in view of the data transfer efficiency.

Further, the coefficient control circuits $C_0$–$C_n$ use the multipliers $m_0$–$m_n$ to control the coefficients. The use of those multipliers, which generally lead to an increase in the circuit scale, is disadvantageous in reducing the overall scale of the adaptive equalizer.

OBJECT AND SUMMARY OF THE INVENTION

Accordingly, it is an object of the present invention to provide an adaptive equalizer which can contribute to reducing the circuit scale while maintaining a high data transfer efficiency.

To achieve this object, according to this invention, there is provided an adaptive equalizer for performing adaptive signal processing on an input digital signal passing through a transfer path so as to minimize an equalization error and sending out a digital signal obtained by the adaptive signal processing, comprising: a variable coefficient filter for performing a filtering process on the input digital signal based on a coefficient set therein; error detection means for detecting the equalization error; and coefficient control means for controlling the coefficient based on the equalization error. The coefficient control means includes: discrimination means for discriminating if an absolute value of each sample value of the input digital signal is greater than a predetermined value; and coefficient generating means for, when the absolute value is discriminated as greater than the predetermined value by the discrimination means, generating the coefficient based on a value obtained by giving a sign according to a sign of that sample value to the equalization error.

DETAILED DESCRIPTION OF THE PREFERRED EMBODIMENTS

The present invention will now be specifically described referring to the accompanying drawings.

Figure 2:
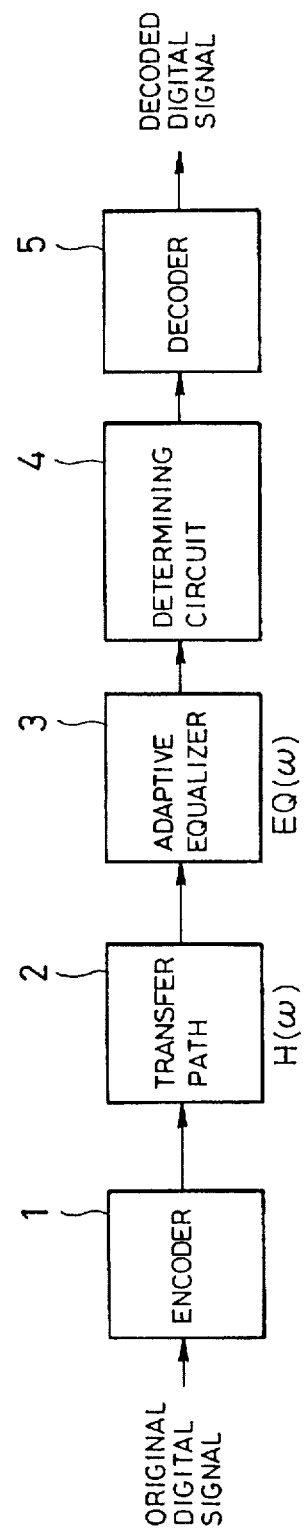
FIG. 2 is a schematic block diagram of a transfer system to which an adaptive equalizer embodying this invention is applied.

FIG. 2 shows the schematic structure of a transfer system to which an adaptive equalizer embodying this invention is applied.

In FIG. 2, an encoder 1 subjects an original digital signal or data signal from an unillustrated signal generation system to a proper encoding process for a transfer path 2 at the subsequent stage, and sends the encoded data signal to an adaptive equalizer 3 via the transfer path 2. The transfer path 2 can take various forms; for example, it is a radio wave, a cable, an optical fiber or the like in the communications field and is a magnetic tape, a magnetic disk, an optical disk or the like in the field where a recording medium is used.

In order to properly supply the data signal traveled through the transfer path 2 to a determining circuit 4 at the next stage, the adaptive equalizer 3 adaptively changes its own transfer characteristic $EQ(\omega)$ to compensate a transfer characteristic $H(\omega)$, which varies in the transfer path 2, so that the characteristic $H(\omega) \times EQ(\omega)$ always becomes constant. The determining circuit 4 sequentially determines the codes of 0 and 1 carried on the data signal that has undergone adaptive processing in the adaptive equalizer 3. The determining circuit 4 converts the data signal which has become, so to speak, dull after passing through the transfer path 2 and the adaptive equalizer 3, to a data signal having proper levels corresponding to the codes of 0 and 1, and sends the converted data signal to a decoder 5. The decoder 5 decodes the data signal from the determining circuit 4 through a reverse process to the encoding process performed by the encoder 1, and sends the decoded data signal to an unillustrated decoded-data processing system.

Figure 3:
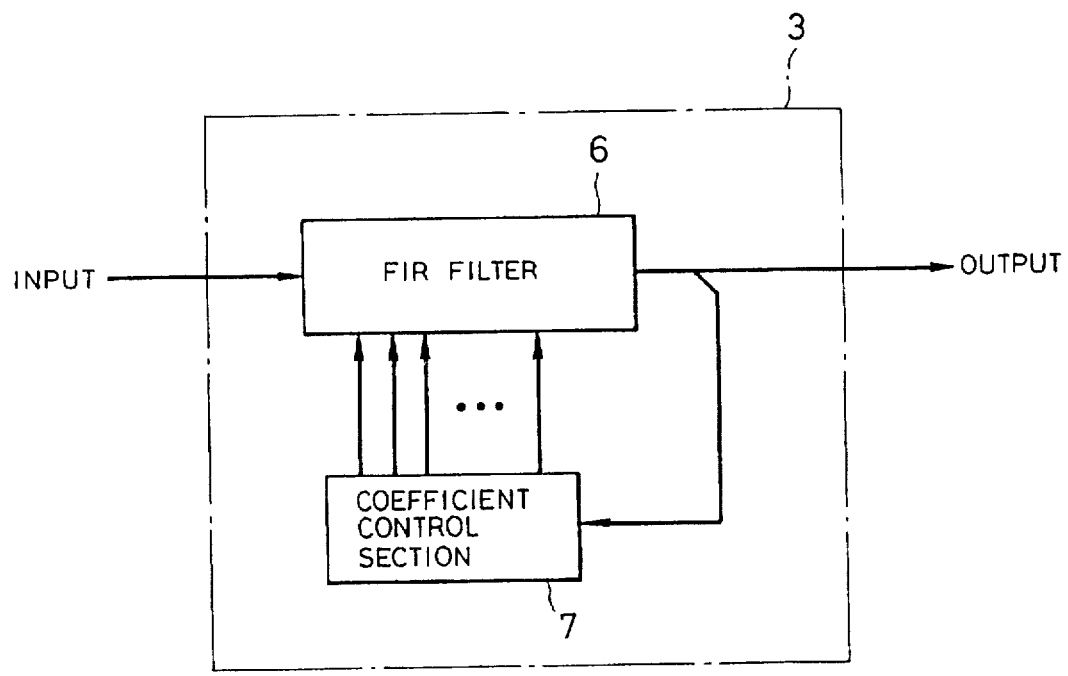
FIG. 3 is a block diagram illustrating the basic structure of the adaptive equalizer shown in FIG. 2.

The basic structure of the adaptive equalizer 3 is shown in FIG. 3.

Referring to FIG. 3, the adaptive equalizer 3 comprises an FIR (Finite Impulse Response) filter 6 to which an input data signal is supplied and a coefficient control section 7 which generates a coefficient control signal based on the output data signal of the FIR filter 6. The FIR filter 6 processes the input data signal to generate an equalized output data signal on the basis of the coefficient which is set in accordance with a control signal from the coefficient control section 7.

Figure 4:
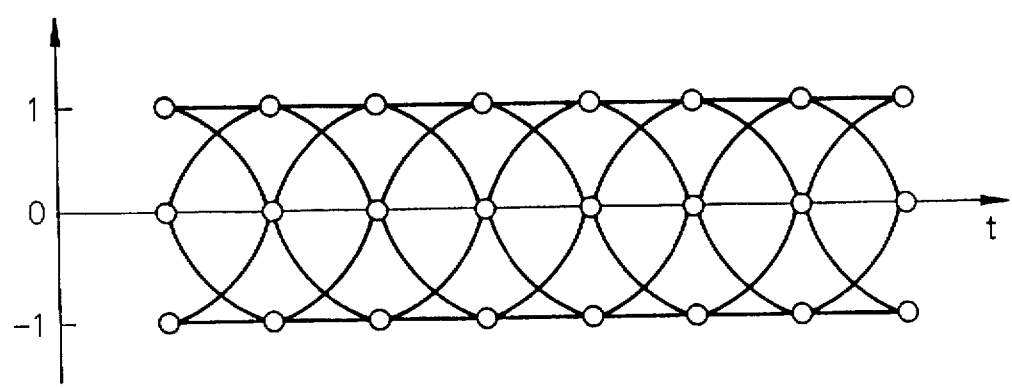
FIG. 4 is a diagram showing the eye pattern of a data signal to be input to the adaptive equalizer shown in FIG. 2.

It is assumed here that the data signal inputted to the adaptive equalizer 3 shows an eye pattern as shown in FIG. 4. This eye pattern appears when the transfer system which includes the encoder 1 and the transfer path 2 before the adaptive equalizer 3 is what is called, for example, the Nyquist's second reference or when it is the class I of a partial response transfer system expressed as PR(1, 1).

A data signal from such a transfer system becomes a discrete signal whose eye pattern always crosses zero and has a value of "1", "0" or "−1" when the data signal is sampled by the channel clock. If the transfer characteristic has been properly equalized, a sample value near the zero-crossing point of the data signal which has such an eye pattern should be 0. With a reference value to be input to the subtracter S being set to "0" in the structure in FIG. 1, therefore, the deviation of the sample value near the zero-crossing point from "0" can be considered as the amount of an equalization error.

Figure 5:
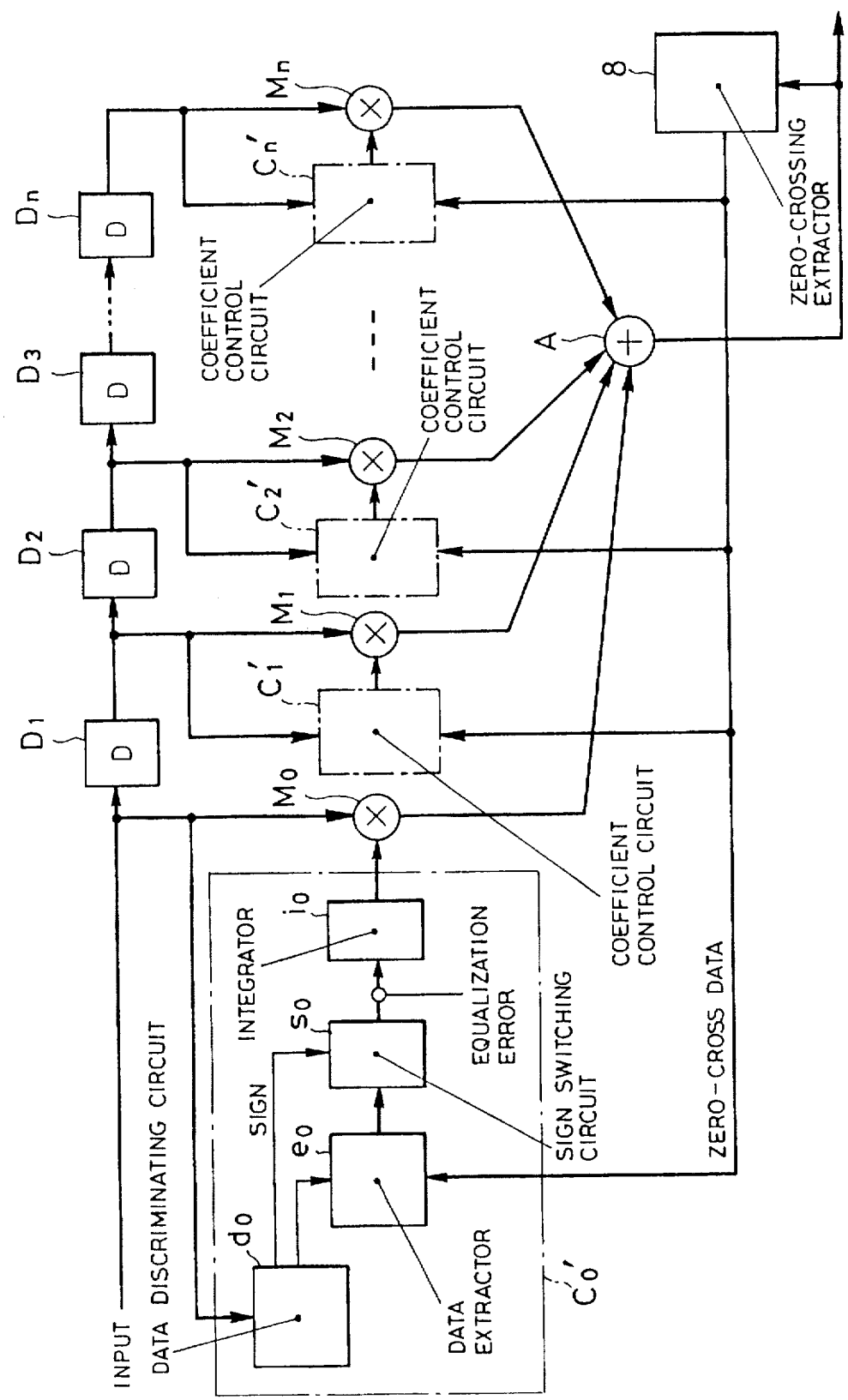
FIG. 5 is a block diagram illustrating the structure of an adaptive equalizer according to the first embodiment of this invention.

FIG. 5 shows an adaptive equalizer which is constructed in the light of the above situation.

Figure 1:
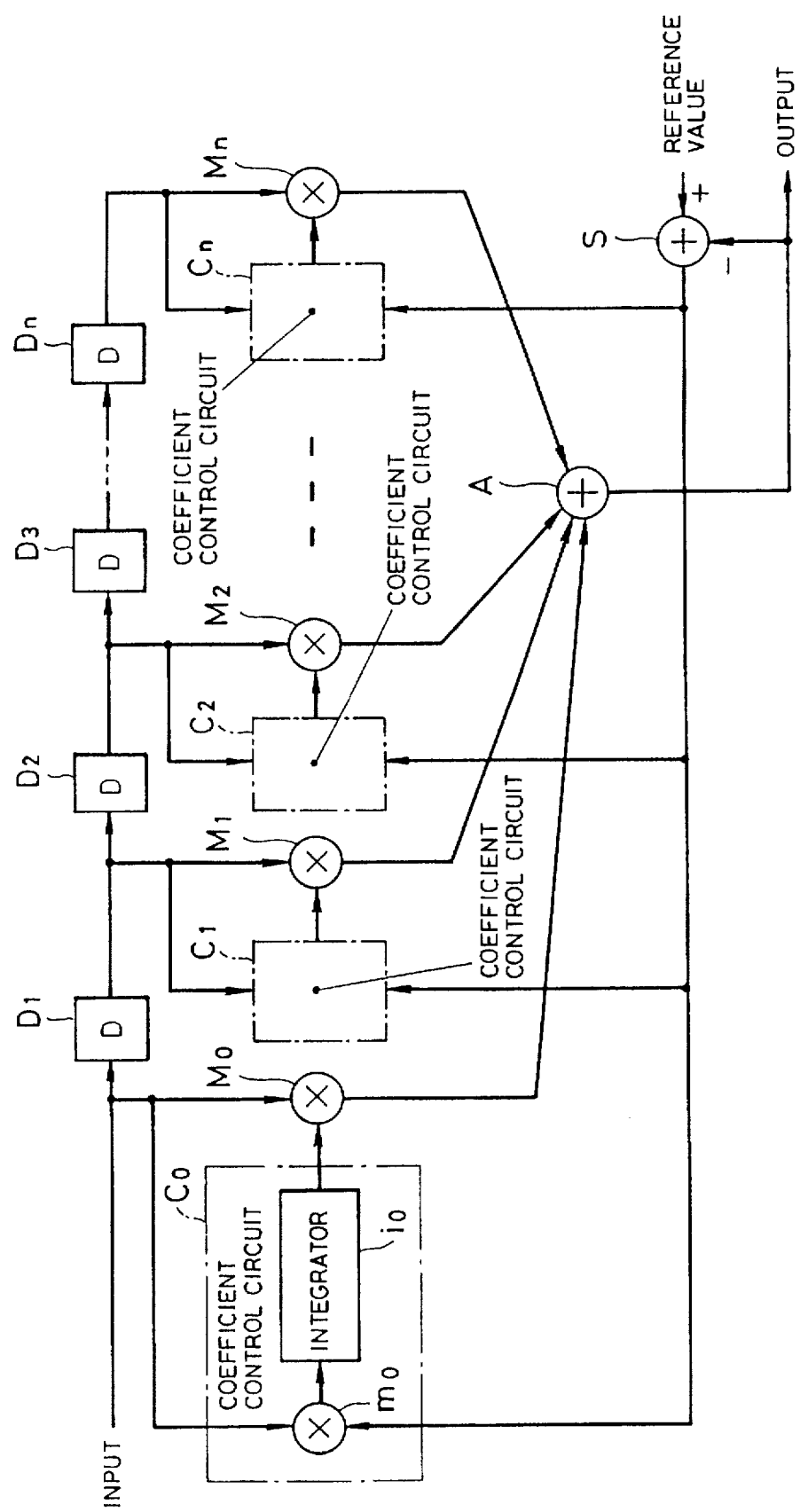
FIG. 1 is a block diagram illustrating the structure of a conventional adaptive equalizer.

Like or same reference numerals are given to those components in FIG. 5 which are the same as the corresponding components in FIG. 1. This adaptive equalizer is characterized in its coefficient control circuits $C_0'$ to $C_n'$ and the system which generates an equalization error to be supplied to those coefficient control circuits.

Figure 6:
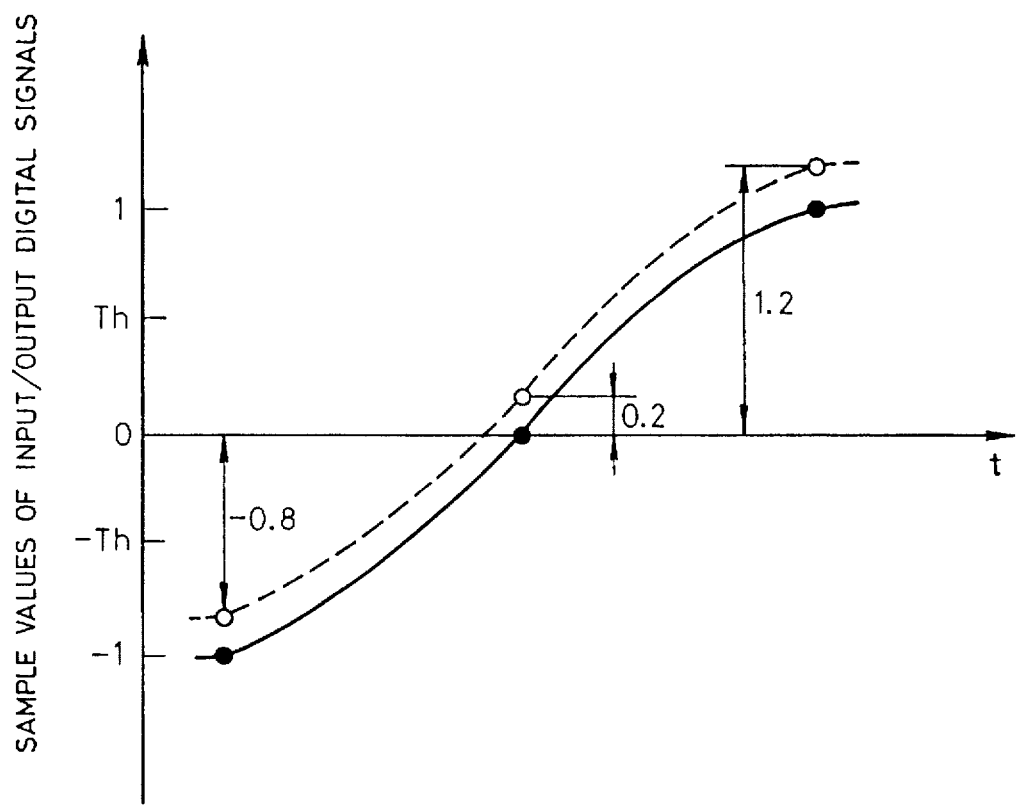
FIG. 6 is a diagram showing sample values of input/ output digital signals for explaining the zero-crossing extraction operation of the adaptive equalizer shown in FIG. 5.

A zero-crossing extractor 8 as the equalization error generating system outputs a sample value near the zero-crossing point of the output digital signal as the absolute value of the equalization error. Referring to FIG. 6, for example, the output digital signal is a sequence of sample values of −1, 0 and +1 along the solid curve when the transfer characteristic of the adaptive equalizer is appropriate, whereas the output digital signal becomes a sequence of sample values of −0.8, +0.2 and +1.2 along the broken curve when the transfer characteristic of the adaptive equalizer is inadequate. With such an improper transfer characteristic, the zero-crossing extractor 8 detects the occurrence of zero-crossing from a change in the sample value from −0.8 to +0.2 or a change in the polarity or sign between consecutive sample values, and extracts the sample value of +0.2, one of the two sample values used in identifying the zero-crossing which is closer to "0". This extracted sample value (hereinafter called "zero-cross data") is the amount (absolute value) of the equalization error itself.

Unlike the coefficient control circuits in FIG. 1, the coefficient control circuits $C_0'$—$C_n'$, which execute coefficient control based on this zero-cross data, are designed without using the multipliers $m_0$–$m_n$. The structure of the coefficient control circuit $C_0'$, which is one of the coefficient control circuits $C_0'$–$C_n'$, will now be discussed. The coefficient control circuit $C_0'$ includes a data discriminating circuit $d_0$ for discriminating which value of "1", "0" or "−1" the input digital signal has or belongs, a data extractor $e_0$ which operates in accordance with the discrimination result, a sign switching circuit $s_0$ and an integrator $i_0$.

More specifically, the data discriminating circuit $d_0$ determines if the value of the input digital signal is greater than a threshold value Th and smaller than a threshold value −Th, both of Th and −Th being shown in FIG. 6. When determining that the value of the input digital signal is greater than the threshold value Th or smaller than the threshold value −Th, the data discriminating circuit $d_0$ sends a signal indicating that the absolute value of the input digital signal is "1" to the data extractor $e_0$. When determining that the value of the input digital signal is greater than the threshold value Th, the data discriminating circuit $d_0$ sends a signal indicating that the value of the input digital signal has a positive sign to the sign switching circuit $s_0$. When determining that the value of the input digital signal is smaller than the threshold value −Th, the data discriminating circuit $d_0$ sends a signal indicating that the value of the input digital signal has a negative sign to the sign switching circuit $s_0$. When it is determined that the value of the input digital signal is equal to or smaller than the threshold value Th and equal to or greater than the threshold value −Th, it is predicted that the input digital signal carries a value of "0".

The data extractor $e_0$ extracts the zero-cross data, that is, passes the zero-cross data to the sign switching circuit $s_0$ when receiving the signal which indicates the absolute value of the input digital signal being "1", but blocks the passage of the zero-cross data and sends data of value "0" to the sign switching circuit $s_0$ otherwise. The sign switching circuit $s_0$ sends the zero-cross data with its sign inverted to the integrator $i_0$ when receiving the signal indicating that the value of the input digital signal has a positive sign and sends the zero-cross data with its sign unchanged to the integrator $i_0$ when receiving the signal indicating that the value of the input digital signal has a negative sign.

Figure 7:
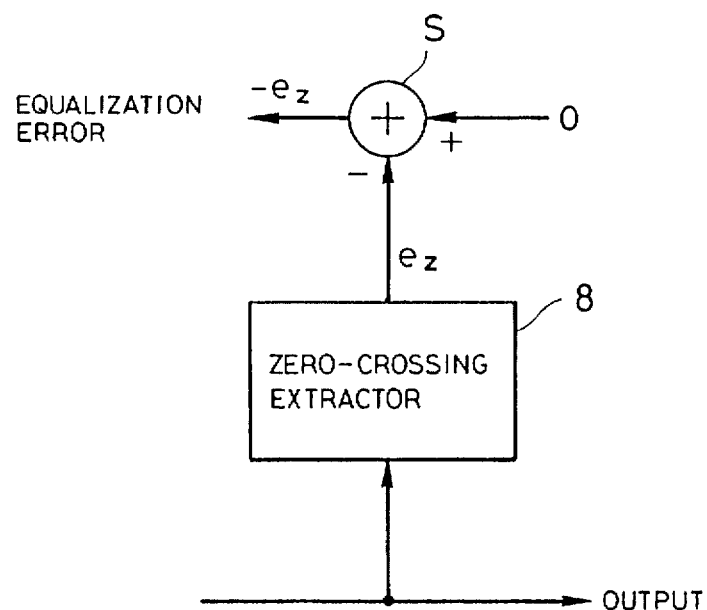
FIG. 7 is a basic model diagram for explaining the sign switching operation of the adaptive equalizer shown in FIG. 5.
Figure 8:
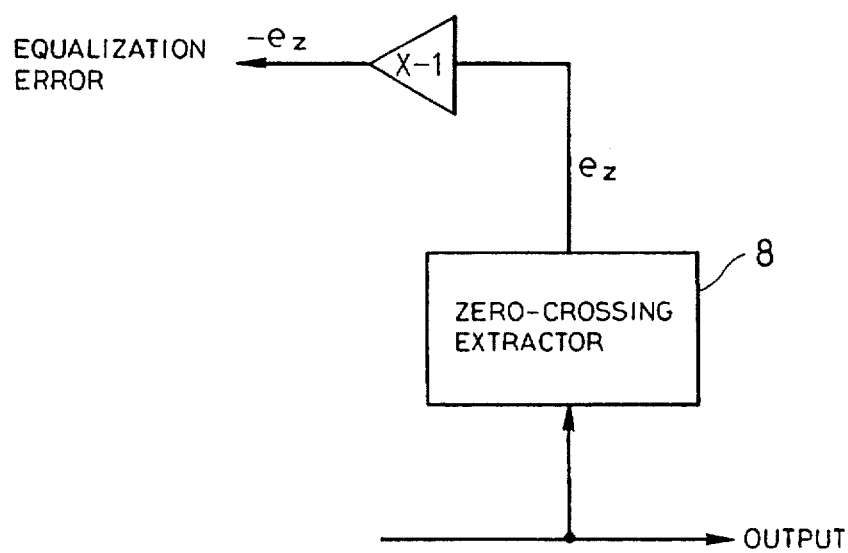
FIG. 8 is a developed model diagram for explaining the sign switching operation of the adaptive equalizer shown in FIG. 5.

Therefore, the coefficient is acquired based on the zero-cross data with its sign inverted when the value of the input digital signal is determined as "1" whereas the coefficient is acquired based on the zero-cross data itself when the value of the input digital signal is determined as "−1". The reason why the sign of the zero-cross data is inverted when the value of the input digital signal is determined as "1" and the sign of the zero-cross data is not inverted when the value of the input digital signal is determined as "−1" may be explained with reference to FIGS. 7 and 8. FIG. 7 shows the principle of generating an equalization error in this embodiment as a general model as shown in FIG. 1. An equalization error is produced by adding the reference value of "0" with the positive sign to the zero-cross data with the negative sign, i.e., by subtracting the zero-cross data from the reference value. This process is equivalent to the multiplication of the zero-cross data by "−1" as shown in FIG. 8, which is performed by the sign switching circuit $s_0$.

The coefficient control circuits $C_1'$ to $C_n'$ have the same structures and functions as those of the coefficient control circuit $C_0'$. The FIR filter 6 (see FIG. 3) which is a variable coefficient filter comprises unit delay elements $D_1$ to $D_n$, multipliers $M_0$ to $M_n$ and the adder A, and the coefficient control section 7 comprises the coefficient control circuits $C_0'$ to $C_n'$ and the zero-crossing extractor 8 in FIG. 5.

Because the structure in FIG. 5 does not use multipliers with large circuit scale in the coefficient control circuits $C_0'$ to $C_n'$, it contributes to reducing the scale of the entire adaptive equalizer. This effect is prominent particularly as the number of stages of the unit delay elements assigned to the adaptive equalizer increases.

Figure 9:
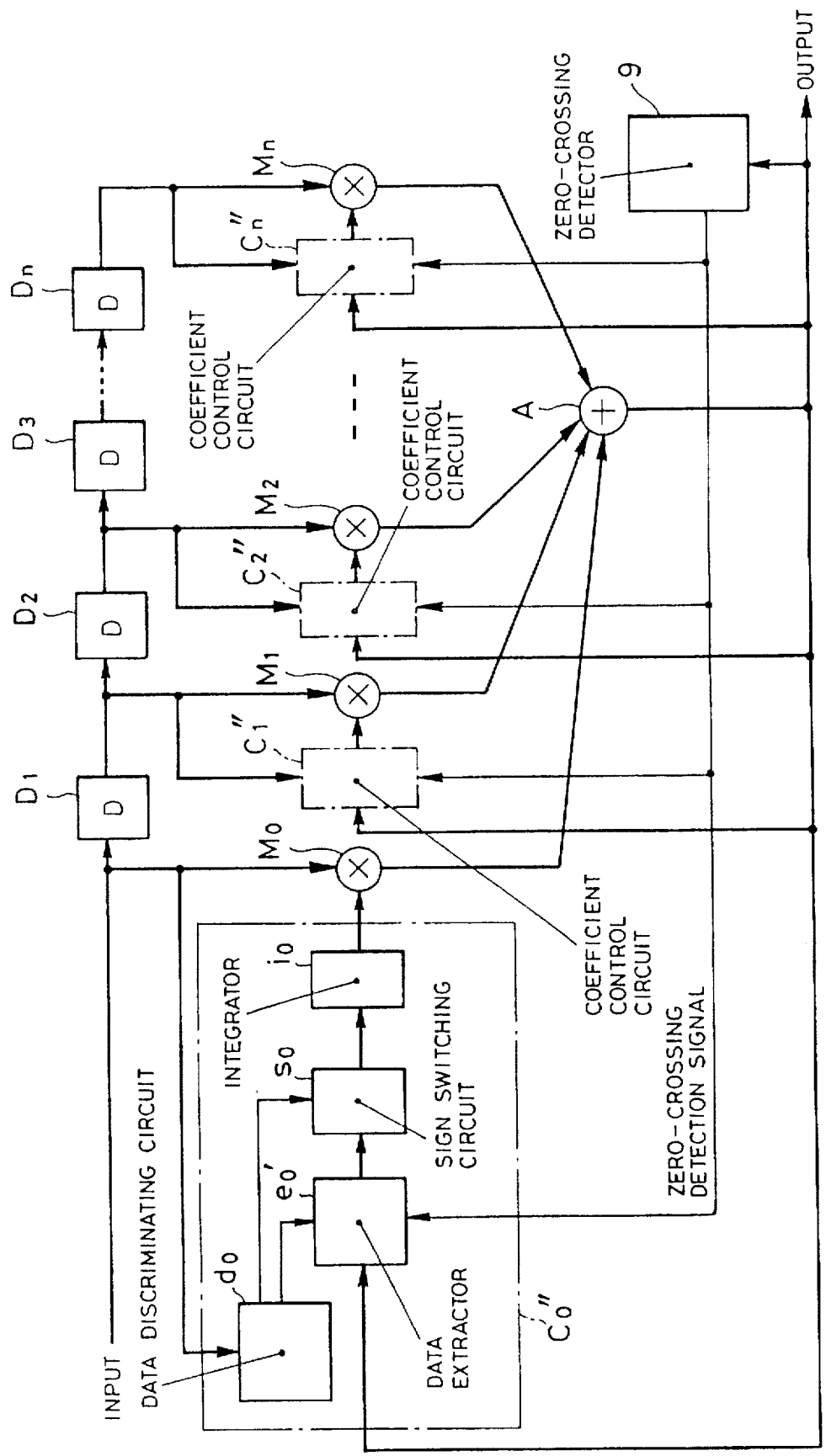
FIG. 9 is a block diagram illustrating the structure of an adaptive equalizer according to the second embodiment of this invention.

FIG. 9 exemplifies an improvement of the structure in FIG. 5, which is characterized in its coefficient control circuits $C_0''$ to $C_n''$ and the system which distributes signals to be supplied to those coefficient control circuits.

Referring to FIG. 9, a zero-crossing detector 9 is provided to detect the zero-crossing timing or the arrival of zero-cross data from the output digital signal. The detection signal from the zero-crossing detector 9 and the output digital signal are both supplied to the coefficient control circuits $C_0''$ to $C_n''$. A data extractor $e_0'$ in the coefficient control circuit $C_0''$ alone does what is performed by the zero-crossing extractor 8 and the data extractor (relay circuit) $e_0$ in FIG. 5. The same is true of data extractors in the other coefficient control circuits $C_1''$ to $C_n''$.

More specifically, the data extractor $e_0'$ extracts zero-cross data, that is, passes the zero-cross data through the sign switching circuit $s_0$ upon reception of the zero-crossing detection signal and the signal indicating that the absolute value of the input digital signal is "1" from the data discriminating circuit $d_0$, but blocks the passage of the zero-cross data and sends data of "0" to the sign switching circuit $s_0$ otherwise. This feature eliminates the redundant structure in FIG. 5 to ensure a simpler structure.

Figure 10:
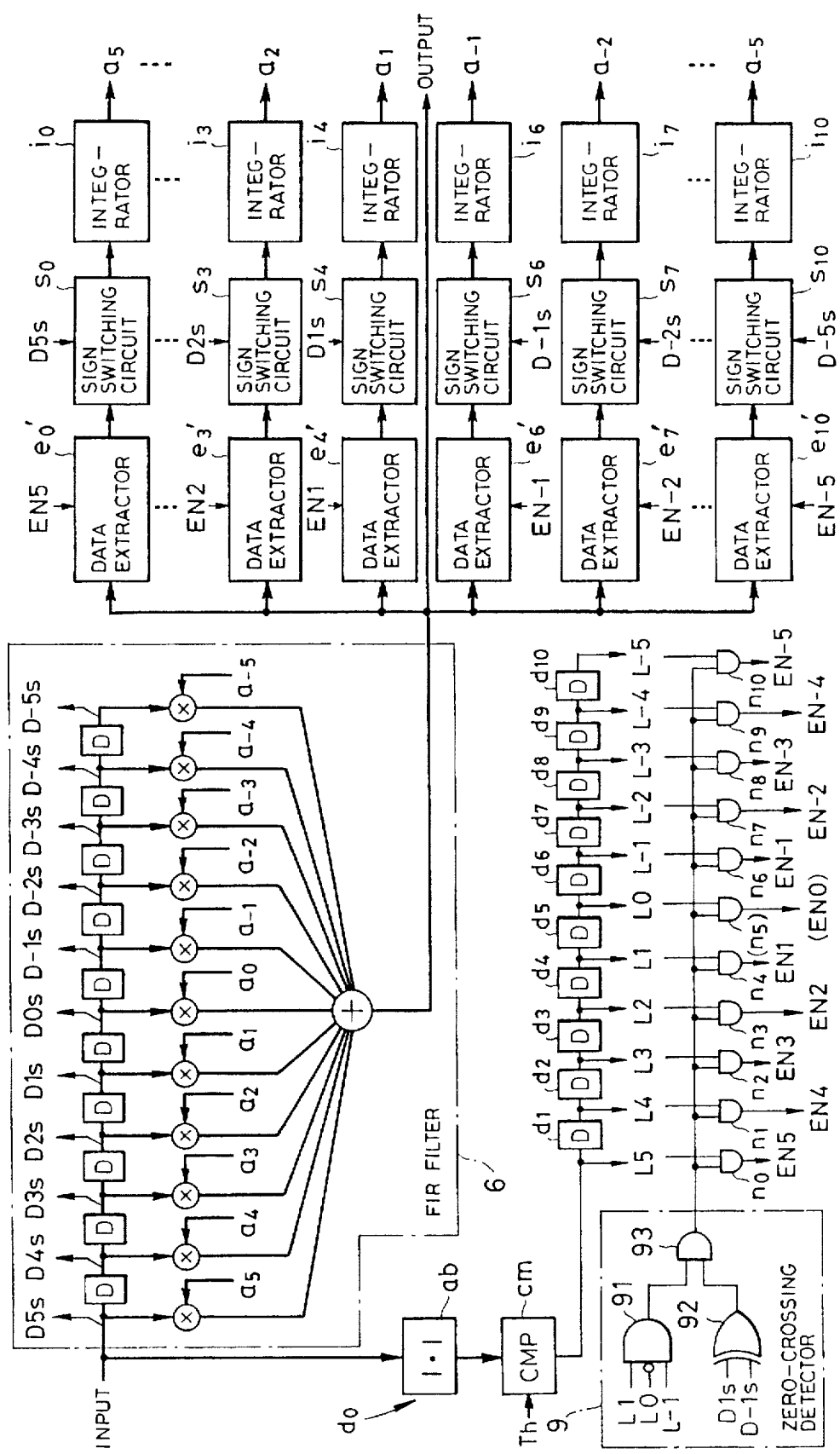
FIG. 10 is a block diagram showing the structure of an adaptive equalizer according to the third embodiment of this invention.

FIG. 10, which shows an equivalent circuit of the structure in FIG. 9, particularly presents the detailed structure of a data discriminating section in each coefficient control circuit.

FIG. 10 exemplifies the case where the FIR filter 6 comprises ten stages of unit delay elements. So-called sign bit signals $D5_s$ to $D-5_s$ respectively assigned to predetermined bits, e.g., MSBs, of the input signal and the output signals of the respective unit delay elements are sent out of the FIR filter 6, and coefficients are externally given to the respective multipliers. A significant difference from the structure shown in FIG. 9 lies in the structure of the data discriminating circuit $d_0$. Specifically, the data discriminating circuit $d_0$ in FIG. 10 comprises: an absolute-value providing circuit ab for sequentially acquiring absolute values of a sequence or train of sample values of the input digital signal; a comparator cm for sequentially comparing the output value of the absolute-value providing circuit ab with the threshold value; cascade-connected unit delay elements $d_1$ to $d_{10}$ which are sequentially supplied with the comparison result and are equal in number to those used in the FIR filter 6; and AND gates $n_1$ to $n_{10}$ which respectively receive input/output signals L5 to L-5 of the unit delay elements $d_1$–$d_{10}$ as one side inputs and respectively receive the zero-crossing detection signal as another side inputs; whereby the respective AND gates gets results EN5 to EN-5 of determination of whether or not the absolute values of the individual sample values of the input digital signal are "1" and whereby sign identifying information is obtained from the sign bit signals $D5_s$ to $D-5_s$.

Unlike the data discriminating circuit $d_0$ shown in FIG. 9 which determines the signals delayed by the unit delay elements $D_1$–$D_n$ (determination of whether or not the absolute values of the sample values are "1"), the data discriminating circuit $d_0$ in FIG. 10 sequentially determines the sample values of the input digital signal and respectively delays the determination results. This structure can still provide the same functions and advantages as discussed with reference to FIGS. 5 and 9.

As apparent from FIG. 10, the zero-crossing detection signal is acquired from the output of an AND gate 93 in the zero-crossing detector 9 that comprises: an AND gate 91 which receives the output signals L1, L0 and L-1 of the unit delay elements $d_4$, $d_5$ and $d_6$ respectively in the non-inverted form, the inverted form and the non-inverted form; an exclusive OR (EXOR) gate 92 which receives the sign bit signals $D1_s$ and $D-1_s$; and the AND gate 93 which receives the outputs of the AND gate 91 and the EXOR gate 92. Further, it is possible to eliminate the system for generating a coefficient $a_0$ corresponding to the zero-cross data, i.e., a data extractor $e_5'$, sign switching circuit $s_5$, integrator $i_5$ and AND gate $n_5$. Furthermore, the coefficient $a_0$ can be fixed in the FIR filter, thus eliminating any multiplier which uses the coefficient $a_0$, and the corresponding output signal of each unit delay element can be input directly to the associated adder.

Figure 11:
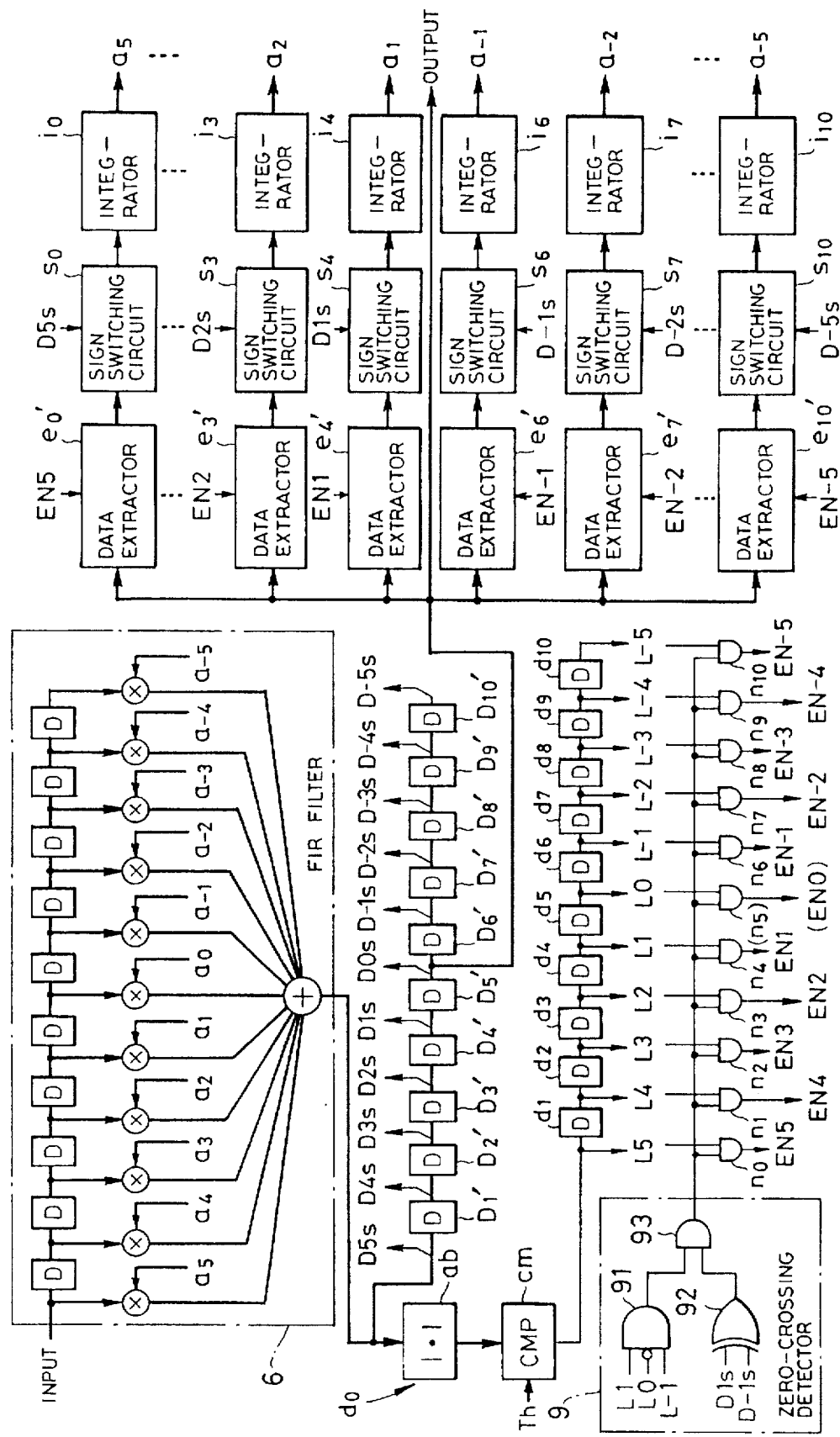
FIG. 11 is a block diagram depicting the structure of an adaptive equalizer according to the fourth embodiment of this invention.

Although the adaptive equalizer in FIG. 10 executes data discrimination using the signal from the input terminal of the FIR filter 6, the adaptive equalizer may be modified to perform data discrimination using the signal from the output terminal of the FIR filter 6 as shown in FIG. 11.

In FIG. 11, the output signal of the FIR filter 6 is sent to the absolute-value providing circuit ab and unit delay elements $D_1'$ to $D_{10}'$ are further provided, which are equal in number to those used in the FIR filter 6 and receive the output signal of the FIR filter 6. The output signal of the unit delay element $D_5'$ in those additional unit delay elements, which is associated with zero-cross data, is led to the output of the adaptive equalizer and is supplied to the data extractors $e_0'$ to $e_{10}'$.

This structure can still provide the same functions and advantages of the examples as discussed above.

The operation of the adaptive equalizer in FIG. 11 will now be partially explained. If the input signal to the transfer path 2 (see FIG. 2) takes values as shown in (a) in FIG. 12, the output signal of the adaptive equalizer 3 and the signals inside the equalizer 3 appear as illustrated in (b) to (f) in FIG. 12.

Figure 12:
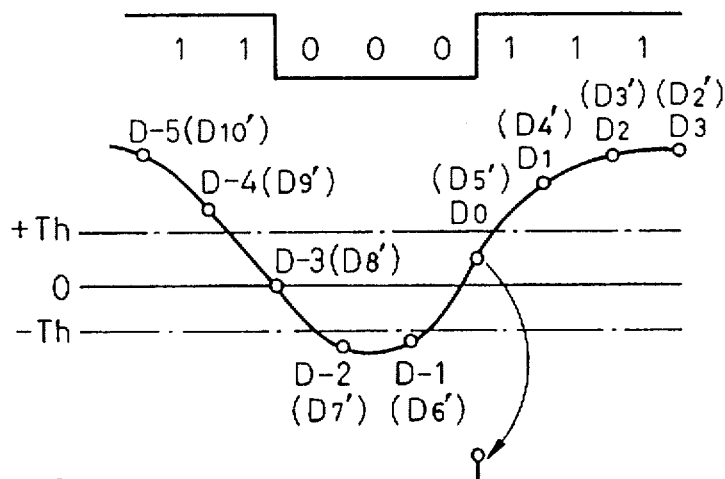
FIG. 12 is a diagram for explaining the operation of the adaptive equalizer shown in FIG. 10.

As shown in (b) of FIG. 12, the output signal (the sequence of sample values) of the equalizer 3 shows a relatively gentle waveform according to the values and changes in them shown in (a) of FIG. 12. In (b) of FIG. 12, mark "○" indicates each sample value affixed with a symbol indicating the associated unit delay element (the sample values D-5 to D3 respectively correspond to the output signals of the unit delay elements $D_{10}'$, $D_9'$, $D_8'$, $D_7'$, $D_6'$, $D_5'$, $D_4'$, $D_3'$ and $D_2'$). In this case, zero-crossing is detected at the sample values D-1, D0 and D1. This is because, in the zero-crossing detector 9, the AND gate 91 which has been given L1=logic "1", L0=logic "0" and L-1=logic "1" (because the absolute values of the sample values D-1, D0 and D1 are respectively greater than "1", smaller than "1" and greater than "1") outputs logic "1", and the EXOR gate 92 which has been given $D1_s$=logic "1" and $D-1_s$=logic "0" (because the signs of the sample values D-1 and D1 are respectively negative and positive) outputs logic "1". Consequently, the AND gate 93 outputs the zero-crossing detection signal of logic "1". Therefore, the AND gates $n_0$–$n_{10}$ can enable the signals L5 to L-5 to transmit, so that only the signals EN-5, EN-4, EN-2, EN-1, EN1, EN2 and EN3 become logic "1" because of the signals L-5, L-4, L-2, L-1, L1, L2 and L3 (because the absolute values of the sample values D-5, D-4, D-2, D-1, D1, D2 and D3 are greater than the threshold value Th), which have logic "1". As a result, only the data extractors $e_{10}'$, $e_9'$, $e_7'$, $e_6'$, $e_4'$, $e_3'$ and $e_2'$ associated with those signals send the output of the delay element $D_5'$ or the sample value D0 to the sign switching circuits $s_{10}$, $s_9$, $s_7$, $s_6$, $s_4$, $s_3$ and $s_2$.

Of the sign switching circuits $s_{10}$, $s_9$, $s_7$, $s_6$, $s_4$, $s_3$ and $s_2$ which receive the sample value D0, the sign switching circuits $s_{10}$, $s_9$, $s_4$, $s_3$ and $s_2$ are supplied with the sign bit signals $D-5_s$, $D-4_s$, $D1_s$, $D2_s$ and $D3_s$ indicating that the sample values D-5, D-4, D1, D2 and D3 are positive. Therefore, the sign of the sample value D0 extracted in the above-discussed manner is inverted so that the signal as shown (d) of in FIG. 12 is supplied to the associated integrators. Consequently, the integrators decrease the associated coefficients $a_{-5}$, $a_{-4}$, $a_1$, $a_2$ and $a_3$ in accordance with the sample value D0.

Since the sign bit signals $D-2_s$ and $D-1_s$ indicating that the sample values D-2 and D-1 are negative are supplied to the respective sign switching circuits $s_7$ and $s_6$, the signals as shown in (e) of FIG. 12 are supplied to the associated integrators without inverting the sign of the sample value D0 extracted as discussed above. As a result, the integrators control to increase the associated coefficients $a_{-2}$ and $a_{-1}$ in accordance with the sample value D0.

As the absolute value of the sample value D-3 is smaller than the threshold value Th, the signal L-3 has logic "0" so that even when the zero-crossing detection signal has logic "1", the signal EN-3 does not have logic "1". This prevents the data extractor $e_8'$ to extract the sample value D0. Consequently, the signal as shown in (f) of FIG. 12 is sent to the integrator $i_8$ from the sign switching circuit $s_8$ regardless of the sign bit signal $D-3_s$, so that the coefficient $a_{-3}$ is not updated at all. This means that the deviation of the sample value D0 from "0" has not been caused by the sample value D-3.

The repetition of the operation associated with the signals in (c) to (f) of FIG. 12 to 12F causes the zero-crossing sample value D0 at the output of the adaptive equalizer 3 to approach "0".

Although the foregoing description has been given with reference to the case where zero-cross data is used to eliminate the use of the reference value (see FIG. 1), other data as will be discussed below may be used as well.

Signals from the transfer system that satisfies the Nyquist's first condition or from the transfer system like PR(1, 1) should have discrete values of either "1" or "−1" or one of "1", "0" and "−1". In this respect, with the reference value set to "1" or "−1", a sample value near "1" or a sample value near "−1" in the filter output signal can be extracted to be used as the amount of an equalization error.

Figure 13:
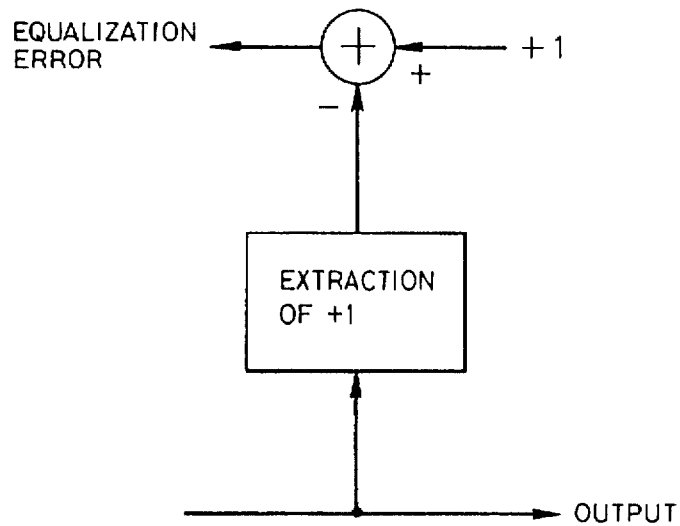
FIG. 13 is a model diagram for explaining one operational principle of another embodiment of this invention.
Figure 14:
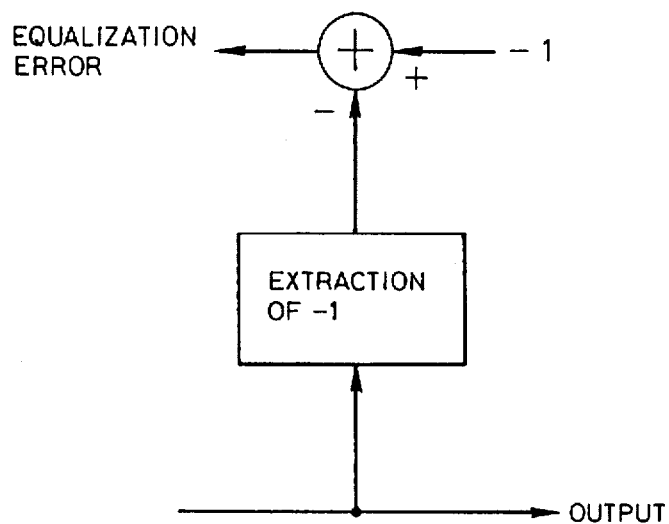
FIG. 14 is a model diagram for explaining another operational principle of another embodiment of this invention.

An equalization error can be produced as shown in FIGS. 13 and 14 as similarly done in FIGS. 7 and 8. In FIG. 13, the reference value is set to "1", a sample value near the value "1" is extracted from the filter output and "1" is subtracted from the extracted sample value to produce an equalization error. In FIG. 14, by contrast, the reference value is set to "−1", a sample value near the value "−1" is extracted from the filter output and "−1" is subtracted from the extracted sample value to produce an equalization error. Both schemes illustrated in FIGS. 13 and 14 may be used to produce an equalization error. A specific example for accomplishing the modification is illustrated in FIG. 15.

Figure 15:
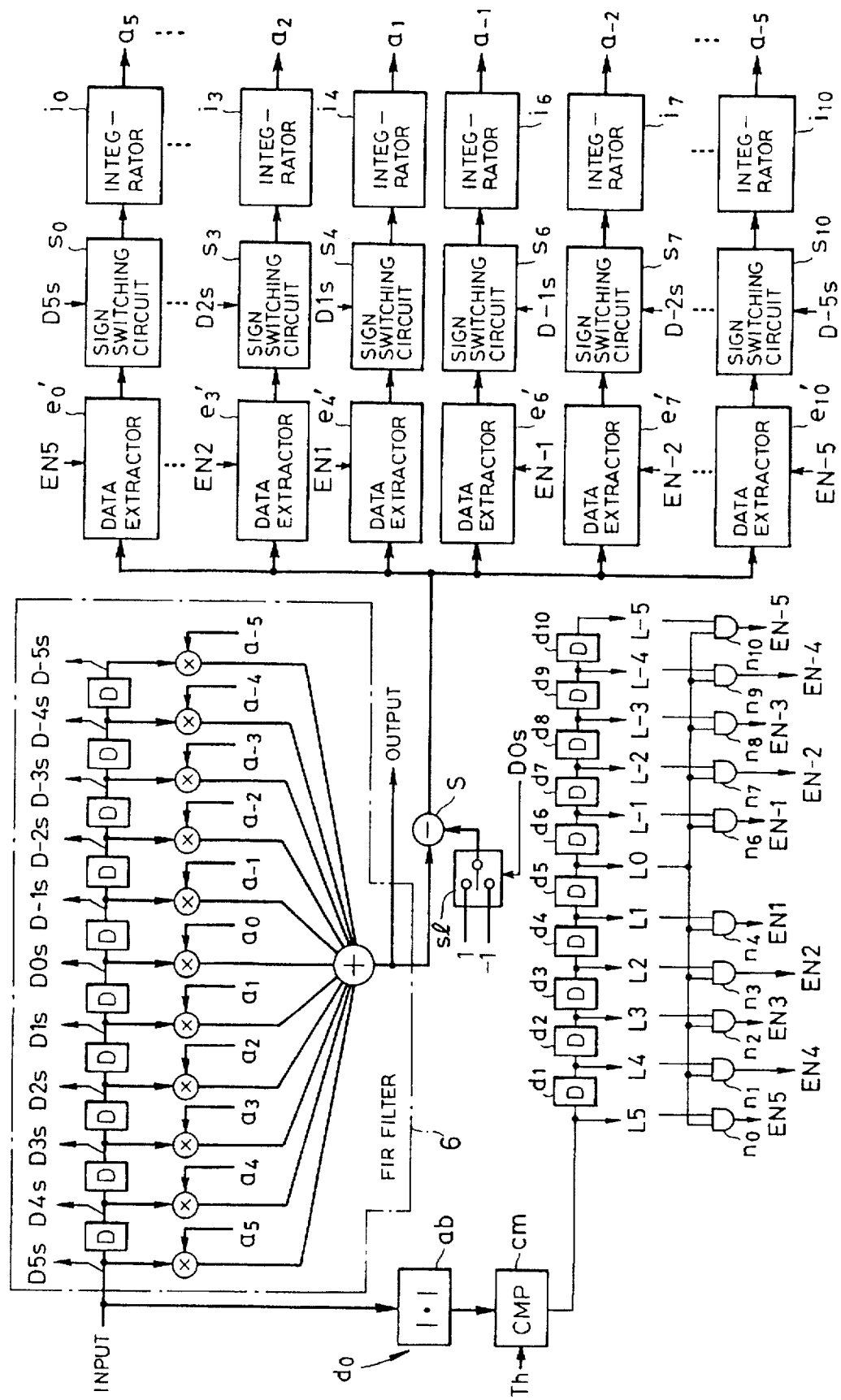
FIG. 15 is a block diagram illustrating the structure of an adaptive equalizer according to the fifth embodiment of this invention.

While the structure in FIG. 15 is based on the structure in FIG. 10, the feature which will be discussed below can be applied to the above-described embodiments. Referring to FIG. 15, the signal which is to be supplied to the data extractors $e_0'$ to $e_{10}'$ is the subtraction output signal of the subtracter S which receives the output signal of the FIR filter 6 as one input. The other input of the subtracter S is the output of a selector s1 which selects either the first reference value of "+1" or the second reference value of "−1" in accordance with a sign bit signal $D0_s$.

While a sample value near "1" in the filter output and a sample value near "−1" therein should be detected instead of zero-crossing detection, this detection function is accomplished by the output signal of the unit delay element $d_5$ as follows. The output signal L0 of the unit delay element $d_5$ having logic "1" means that the absolute value of the associated sample value is greater than the threshold value Th, i.e., this sample value carries either "+1" or "−1". Supplying this signal L0 to the AND gates $n_0$ to $n_{10}$ can therefore produce the signal EN for extracting a sample value near "1" and a sample value near "−1" in the filter output.

The sign bit signal $D0_s$ corresponds to the output signal L0 and indicates the sign of the sample value data including this sign bit signal $D0_s$. The selector s1 gives the reference value "+1" to the subtracter S when the sign of the data is positive but gives the reference value "−1" to the subtracter S when the sign of the data is negative. As a result, an equalization error based on the reference value of "+1" is acquired from the output of the subtracter S when the data extractors $e_0'$ to $e_{10}'$ should extract a sample value near "1" in the filter output, while an equalization error based on the reference value of "−1" is acquired from the output of the subtracter S when the data extractors $e_0'$ to $e_{10}'$ should extract a sample value near "−1" in the filter output.

Although FIG. 15 illustrates the example where the reference values of "1" and "−1" are used, the structure may be modified to use only one of the reference values as mentioned earlier. And further the structure may be combined with the structure which uses a reference value of "0" as shown in FIGS. 5 and 9–11.

Although restrictive descriptions have been given of various kinds of means in the above embodiments, it should be apparent to those skilled in the art that the present invention may be embodied in many other specific forms without departing from the spirit or scope of the invention.

The adaptive equalizer embodying this invention can contribute to reducing the circuit scale while maintaining a high data transfer efficiency.

What is claimed is:

1. An adaptive equalizer for performing adaptive signal processing on an input digital signal passing through a transfer path so as to minimize an equalization error and sending out a digital signal obtained by said adaptive signal processing, comprising:

a variable coefficient filter for performing a filtering process on said input digital signal based on a coefficient set therein;

error detection means for detecting said equalization error; and coefficient control means for controlling said coefficient based on said equalization error, said coefficient control means including: discrimination means for discriminating if an absolute value of each sample value of said input digital signal is greater than a predetermined value; and coefficient generating means for, when said absolute value is discriminated as greater than said predetermined value by said discrimination means, generating said coefficient based on a value obtained by giving a sign according to a sign of that sample value to said equalization error.

2. The adaptive equalizer according to claim 1, wherein said error detection means acquires an amount of said equalization error from a sample value near a zero-crossing point of the digital signal obtained by said adaptive signal processing.

3. The adaptive equalizer according to claim 2, wherein said coefficient generating means includes: extraction means for, when said absolute value is discriminated as greater than said predetermined value by said discrimination means, extracting a sample value near a zero-crossing point of the digital signal obtained by said adaptive signal processing; and sign switching means for inverting a sign of the sample value extracted by said extraction means when any sample value of said input digital signal whose absolute value is discriminated as greater than said predetermined value by said discrimination means has a positive sign, but leaving the sign of the extracted sample value uninverted otherwise.

4. The adaptive equalizer according to claim 3, wherein said coefficient generating means further includes an integrator for integrating an output signal of said sign switching means and sets said coefficient in accordance with an output value of said integrator.

5. The adaptive equalizer according to claim 1, wherein said error detection means obtains an amount of said equalization error from a sample value near +1 of the digital signal obtained by said adaptive signal processing.

6. The adaptive equalizer according to claim 1, wherein said error detection means obtains an amount of said equalization error from a sample value near −1 of the digital signal obtained by said adaptive signal processing.

* * * * *